(12) United States Patent
Buestgens et al.

(10) Patent No.: US 8,556,227 B2
(45) Date of Patent: Oct. 15, 2013

(54) TEMPERATURE-COMPENSATED PIEZOELECTRIC FLEXURAL TRANSDUCER

(75) Inventors: Burkhard Buestgens, Gundelfingen (DE); Suheel Roland Georges, Freiburg (DE)

(73) Assignee: Burkhard Buestgens, Gundelfingen (DE)

( * ) Notice: Subject to any disclaimer, the term of this patent is extended or adjusted under 35 U.S.C. 154(b) by 531 days.

(21) Appl. No.: 12/838,558

(22) Filed: Jul. 19, 2010

(65) Prior Publication Data

US 2011/0168929 A1  Jul. 14, 2011

Related U.S. Application Data

(60) Provisional application No. 61/226,753, filed on Jul. 20, 2009.

(51) Int. Cl.
*F16K 31/02* (2006.01)
(52) U.S. Cl.
USPC ............ 251/129.01; 251/129.02; 251/129.06; 310/326; 310/330
(58) Field of Classification Search
USPC ........ 251/129.01, 129.02, 129.06, 11, 54, 57; 310/326, 327, 330, 328
See application file for complete search history.

(56) References Cited

U.S. PATENT DOCUMENTS

| | | | |
|---|---|---|---|
| 5,343,894 A * | 9/1994 | Frisch et al. | 137/625.65 |
| 5,779,218 A | 7/1998 | Kowanz | |
| 6,032,923 A * | 3/2000 | Biegelsen et al. | 251/129.01 |
| 6,581,638 B2 * | 6/2003 | Frisch et al. | 137/596.17 |
| 6,879,089 B2 * | 4/2005 | Wong et al. | 310/328 |
| 7,659,654 B2 * | 2/2010 | Kondo | 310/330 |
| 7,671,517 B2 * | 3/2010 | Ishimasa et al. | 310/353 |

* cited by examiner

*Primary Examiner* — Eric Keasel
*Assistant Examiner* — Ian Paquette

(57) ABSTRACT

It is introduced a miniaturizable actuation device based on piezoelectric flexural transducer element, which can be fabricated easily and cost effective, for use in a fluid valve or other devices, the actuation device being suited to perform reproducible actuation deflections fast and precisely, uneffected by disturbing influences due to temperature changes and mechanical deformations of the housing. The actuation device according to the invention includes a fluid bearing 5 with a first surface 7, which is associated with the flexural transducer element 2, a second surface 8, which is associated with the housing 15, and a flowable power transmitting fluid 6 between the surfaces, to transmit the reaction forces and—moments resulting from the actuatro deflection from the flexural transducer element 2 to the housing 15.

14 Claims, 4 Drawing Sheets

TEMPERATURE-COMPENSATED PIEZOELECTRIC FLEXURAL TRANSDUCER

TECHNICAL FIELD

The invention relates to a miniature piezo flexural transducer element, in particular a miniature-valve system to control fluids using a piezoelectric flexural transducer element with a short response time.

Piezoelectric flexural transducer elements are actuators for generating an actuator deflection 14 in a non-clamped area and are composed out of several material layers with at least one piezoelectric layer. The layers are particularly in the monomorph configuration characterized by different thermal expansion coefficients. Temperature changes, operation-related housing-deformations or aging processes can superimpose erratic deflections to the usable actuator deflection 14 with a magnitude in the same order, thus strongly affecting functionality of the actuator.

BACKGROUND ART

U.S. Pat. No. 6,581,638 describes a valve with a compact piezoelectric flexural transducer unit, comprising two at a pivot bearing jointly connected flexural elements with a common carrier layer. The flexural transducer unit comprises an enlarged valve lift compared to a simple flexural transducer. As another advantage of this configuration it is shown in U.S. Pat. No. 6,581,638 that due to the pivot bearing and the identical structure of the two flexural elements an automatic compensation of temperature-related deformations of the flexural elements occurs as a result. Compared to conventional piezoelectric flexural elements the double overall width is however disadvantageous, which e.q. is unfavorable for use in valve arrays with low channel spacing. The technically complex fabrication of the flexural transducer unit is further disadvantageous.

To compensate for slow deformations caused by temperature changes, aging, mechanical strain or creep it is proposed in EP 148 630 to insert a power transmission device into the path of power transmission between the moving end of an actuator and a working device, the power transmission device allowing to almost fully transfer the movement of the actuator. The power transmission device includes a power transmission element, which the actuator is associated with, a force receiving element, which the working device is associated with and a viscous liquid in a gap between the transmission element and the force receiving element, which behaves hard in case of fast actuator deflections, but which does not transfer slow-running parasitic movements to the working device.

In EP 148 630 it is further mentioned, that the described power transmission device is principally applicable within a valve comprising a bimorph piezoelectric flexural transducer. So according to EP 148 630 the proposed power transmission device would be installed between the moving end of a piezoelectric flexural transducer and e.g. a valve closure element. When applied to a miniature valve system with driving forces below 50 mN the total mass of the transmission device would have to be moved, so the switching times would be influenced strongly negative. Also most delicate fabrication and assembly steps would have to be carried out.

DISCLOSURE OF INVENTION

Based on EP 148 630, it is the task of the invention to introduce a miniaturizable, while easy and inexpensive to fabricate actuating device according to the preamble of claim 1, in particular for use in a fluid valve, which is suited to carry out fast and reproducible acuator movement 14, which are unaffected by the above parasitic movements. The task is solved by the characteristics of claim 1. Thereafter, the actuation device according to the invention includes a fluid bearing 5 with a first surface 7 being assigned to the flexural transducer element 2, with a second surface 8 being assigned to housing 15 and a power transmission fluid 6 between the surfaces, to transfer the reaction forces and torques, which are resulting from the actuator deflection 14 of the flexural transducer element, to the housing 15.

Due to the flow-capability of the power transmission fluid the fluid bearing is suited to compensate for slow position and geometry changes of flexural transducer and housing, without transferring significant flexural forces between the housing and transducer element. The fluid bearing thus effects a compensation of deformations or stresses of the piezo flexural transducer or other parts due to temperature change, forces, stress, aging and drift. In contrast to conventional flexural transducers, where such stresses or parasitic movements influence the actuation characteristics of the actuator, by incorporating a fluid bearing these can no more have an impact on the actuating mechanism. The fluid bearing according to the invention further spares elaborate efforts for temperature compensation and the need for precise assembly. Due to the fluid bearing also larger deformations of the housing can be accepted, which e.g. can appear within pressure loaded fluid valves. This allows altogether a space and material-saving design, particularly miniaturization.

Appropriate embodiments of the actuation device according to the invention including advantageous developments and embodiments of the invention are given in the further claims. Thereby a flat, preferably elongated flexural transducer element out of several stacked layers of material is assumed, of which at least one layer possesses piezoelectric properties.

For a better understanding of the description of the invention in the following it is assumed, that the flexural transducer element is lying in the horizontal XY plane and that travel is directed perpendicularly from the plane into the positive Z direction.

According to an advantageous embodiment reaction forces or torques are transmitted from a surface of the transducer element via the viscous power transmitting fluid to a surface of the housing. In a further preferred variant the surface of the flexural transducer element is the surface of a substrate layer of the flexural transducer element. By utilizing surfaces of the flexural transducer element and of the housing as part of the fluid bearing the actuation device can be fabricated very easy and inexpensive. An exceptionally effective power transfer is given by a further suitable embodiment, in which the viscous power transmitting fluid is within a gap between the surface of the flexural transducer element and the surface of the housing. Finally, another embodiment is proposed, characterized in that the surface of the housing is an inner surface of an open oder closed cavity.

A further suitable embodiment is proposed with the flexural transducer element being floating-mounted within the XY plane. The lateral mobility of the flexural transducer element is thereby bounded by lateral stops 11, which are located in the housing of the actuation device. The pivot bearing of the piezo element as described in the preamble in this case is practically carried out as a simple free support.

To determine a first and/or second stable reference position of the control travel of the flexural transducer element suitable embodiments include a first and/or second reference stop Zref in the case. These may correspond to a non-actuated or an actuated state. The stops are located in a region of the housing in which the flexural transducer element performs its control travel. In a first preferred embodiment there is located one reference stop with respect to the direction of travel, which is realized in the form of a stop for the flexural transducer element in the housing or in a structure that is immobile relative to the housing.

In a preferred embodiment the flexural transducer element is maintained by an appropriate force in a reference position. The force can for example be a mechanical force, a compressive force or a force that results from the surface tension of a fluid transmission material in interaction with the housing. The fluid bearing according to the invention thereby ensures that the flexural transducer element in this reference position is in a reproducible initial state independent of deformations, internal stresses.

The actuation device is preferably suited for the use in a valve, more preferably in a micro valve. This comprises a sealing member, which is assigned to the flexural transducer element, a valve seat, which is assigned to the housing and a fluid passage in the housing. In an easy to fabricate embodiment the sealing member is formed by a layer of the flexural transducer element, in particular by the substrate layer itself.

In an embodiment as a normally-closed valve the valve seat itself forms the reference stop that defines the reverence position Zref of the transducer element. The force for closing the valve can be composed, for example, out of a (a) pressure force generated by the fluid onto the closed sealing element, (b) out of a mechanical pressure force generated by a pressure spring, which acts on the flexural transducer element, or (c) out of a surface tension force of the viscous power transmitting fluid.

In a normally open variant, in the direction of travel of the flexural transducer element, two opposing stops are integrated in one or two housing parts, which functionally define the travel range of the flexural transducer element, whereby a first stop forms the reference stop the piezo is in contact with in the non-actuated state and the second stop is formed by the valve seat. When actuating the micro valve the piezo flexural transducer lifts off from the first stop and closes at the valve seat, which is the second stop, the fluid passage.

In a normally open variant, in the direction of travel of the flexural transducer element, two opposing stops are integrated in one or two housing parts, which functionally define the travel range of the flexural transducer element, whereby a first stop is formed by a first valve seat which is assigned to a first fluid passage and the second stop and a second stop is formed by a second valve seat which is assigned to a second fluid passage. In a preferred embodiment, the respective forces for closing the fluid passages are essentially or exclusively based on pressure forces exercised by the fluid on the respective valve-sealing. In a more preferred variant the sealing parts are part of the flexural transducer element, in particular the passive layer of the flexural transducer element itself.

MODE(S) FOR CARRYING OUT THE INVENTION

Figure 1:
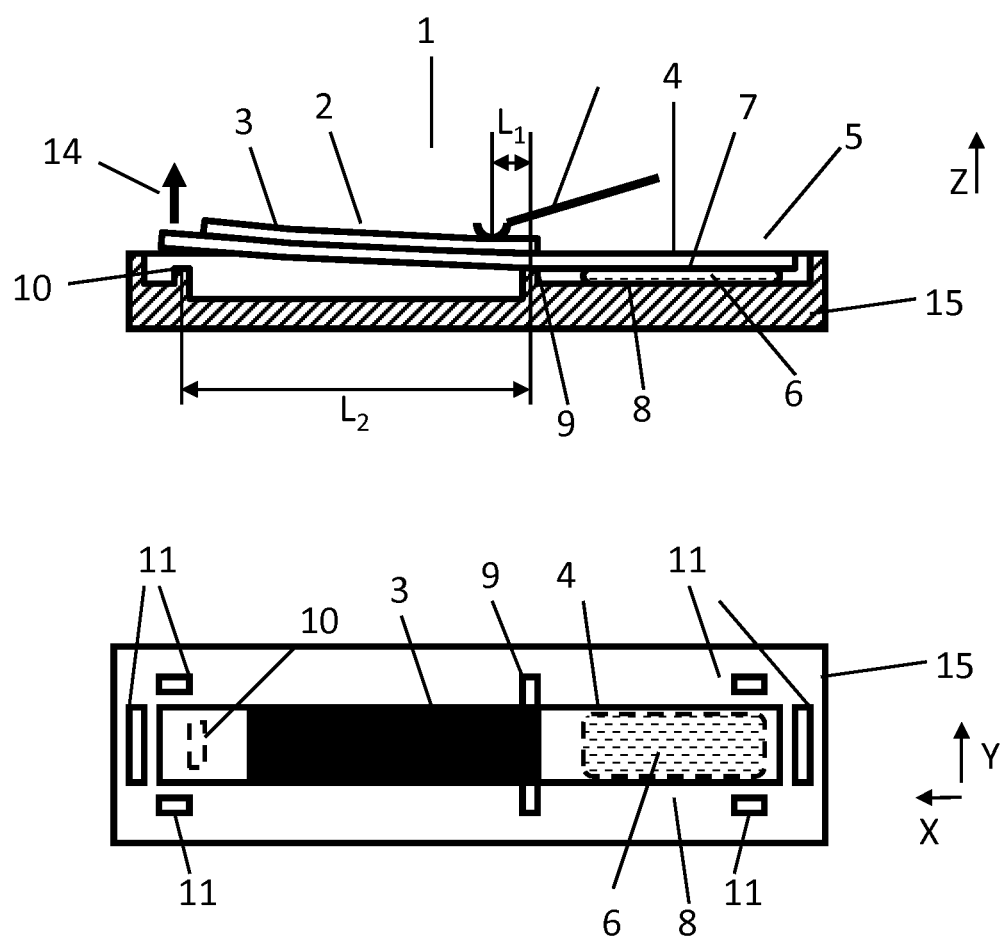
FIG. 1 shows a side sectional view and a top view of a actuation device according to the invention in the actuated state.

In FIG. 1 is sketched an embodiment of an actuation device 1 according to the invention, which contains a flexural transducer element 2 in a single- or multi-part housing 15, outlined schematically in a side sectional view and a top view. As a flexural transducer element within the context of this invention a coherent component shall be understood, which contains the piezoelectric flexural transducers. The basic structure and function of a piezo-electric flexural transducer is assumed to be known here. The within the invention preferably used monomorphic-flexural elements usually beside the active piezoelectric layer 3 contain a passive substrate layer 4 of an adequate solid, non-piezoelectric material. The active piezoelectric layer 3 in several preferred embodiments covers the substrate layer 4 only in sections. The substrate layer as part of the flexural transducer element 2 can, for example, include the sealing element of a valve, mounting structures, or parts or structures that prevent shifting. In FIG. 1 such a preferred embodiment of a flexural transducer element is shown. On the left the flexural transducer element is configured as a flexural actuator, with a piezoelectric layer and a preferably metallic substrate layer. It is movable with respect to the 14, so the left-field area can be referred to as the movable section. With respect to the example of FIG. 1 control work is done in the region of the substrate layer, which protrudes at the left side. The half of the flexural transducer element which is located at the right of the support 9 is used as the fluid bearing according to the invention to give support the flexural transducer element, so this region also can be called the bearing—or clamping region.

The flexural transducer element can be built up fully or partially as a piezoelectric flexural actuator consisting at least one piezoelectric layer. In the simplest case the flexural transducer element is built up from its left to the right end as monomorph or bimorph flexural actuator. Preferably, the flexural transducer element is only in its movable section configured as monomorphic or bimorphic flexural actuator. In the region of the fluid bearing the flexural transducer element is preferably comprising only one layer, such as the part of the substrate layer, which is not covered with a piezoelectric layer.

Typical thicknesses of the layers of the flexural actuator are between 0.1 mm and 0.5 mm, in special cases up to 1 mm. The choice of material for the substrate layer is basically not limited, preferably suitable materials are for example metals such as stainless steel, brass or beryllium copper, glass, ceramics, some plastics, semiconductor materials, or (carbon) fiber-reinforced materials.

The flexural transducer element 2 is at least at one point, the pivot bearing 9, in mechanical contact with the housing 15 or with structures that are fix in relation to the housing. At the pivot bearing 9 the flexural transducer element 2 is pivoted around the Y-axis. In the configuration as in FIG. 1 the pivot bearing 9 is about in the middle of the flexural transducer element. As a pivot bearing a bearing is understood, that does not transfer a torque around the y-axis. A preferred embodiment of a pivot bearing is a support, which mainly transfers positive forces in Z-direction. In the configuration as a support, the flexural transducer element can be pressed by a dedicated pressing mechanism onto the support in the housing, the pressing mechanism being for example realized as a metal spring that presses on the flexural transducer element at the position of the support. The pivot bearing of the transducer element requires additional means to ensure that its position is determined statically: A reference stop 10 acting in Z-direction is located in the housing at a position, where the flexural transducer element performs its actuator deflection 14. The reference stop defines for a given actuation state the pivotal reference position of the flexural transducer element about the pivot bearing 9. Accordingly it defines a reference position for the actuator deflection 14 of the actuator. In the case of a normally closed valve it is for example advantageous if a valve seat itself forms such a reference stop 10.

A working device, which primarily comprises two defined control states, preferably contains two reference stops, for example one upper acting in negative Z-direction and one lower acting in the positive Z-direction, the stops corresponding to a powered or a non-powered actuator state.

In the top view of FIG. 1, for example, an embodiment of a floating bearing of the flexural transducer element 2 is illustrated. Lateral stops 11 limit the lateral movement of the flexural transducer element by their vertical surfaces. Instead of arranging the stops beside the flexural transducer element 2, laterally acting stops can also be configured to protrude into openings in the flexural transducer element with a defined play, thus securing a loose geometric fixation in lateral direction.

To keep the flexural transducer element in contact with the reference stop 10, a force or torque must be applied to the flexural transducer element by a suitable mechanism. As illustrated in the example of FIG. 1, the force is applied by a mechanical pressing device in the form of a spring element 12, which presses on a layer of the flexural transducer element. The point of contact is preferably located near the pivot bearing, more preferably at a distance L1 from the pivot bearing, whereby the ratio of L1 to L2, the latter being the distance between the point of contact and the pivot bearing, is preferably in the range between 0.02 and 0.3. In relation to the flexural transducer element either the point of contact of the spring element 12 is on the back between the reference stop 10 and the pivot bearing 9 or the pivot bearing 9 is on the back between the reference stop 10 and the point of contact of the spring element 12 (not shown in FIG. 1).

In an advantageous variant the spring element is additionally used as an electrical contact to a first layer of the flexural transducer element, in particular to the piezoelectric layer. Further advantageous the contact point between the top layer of the piezo element and the spring element can be used as the contact point to establish an electrical contact. To form the functionally required second electrical contact, in particular the ground contact at the bottom side of the piezoelectric layer, it is advantageous, if the substrate layer is out of an electrically conducting material, in particular out of metal.

In an advantageous variant a second layer of the flexural transducer element, in particular the substrate layer, is electrically contacted at the mechanical contact point of the pivot bearing 9. Advantageously this is the ground contact. The spring element 12 in this configuration provides the contact pressure to establish a reliable electrical contact.

According to the invention, a fluid bearing 5 transmits the reaction forces and—torques, which result from the actuator deflection 14 of the flexural transducer element, via the viscous power transmitting fluid 6 to the housing 15.

In the embodiment in FIG. 1, the fluid bearing is located in an area of the flexural transducer element on the right side of the pivot bearing 9 and contains as an active component a gap between a surface 7, which is assigned to the flexural transducer element and a surface 8 that is assigned to the housing 15, whereby the gap is at least partly filled with a viscous power transmitting fluid 6. Surfaces 6 and 7 as well as the intervening gap are according to the embodiment in FIG. 1 aligned parallel to the XY plane.

The power transfer fluid 6 is configured such, that it is flowable in case of slow movements or deformations, i.e. that it does not establish a considerable resistance against the movements or deformations. In case of fast movements or deformations the power transfer fluid, which favorably is medium or highly viscous, acts as a rigid bearing while exhibiting high shear stresses. If for example a force is applied to the carrier layer 4 at the point of the fluid bearing, power transfer fluid is displaced out of the gap. But the high viscosity of the viscous power transmitting fluid prevents the fluid from leaving the gap. In case of fast movements, therefore, the power transfer material behaves almost rigid, so that the fluid bearing is able to transfer forces vertically to the gap. According to the invention these forces are the reaction forces or support-forces of the flexural transducer element in the case of fast actuator deflections 14. It should be noted that the embodiment in FIG. 1 is only one out of the many possible embodiments to realize a fluid bearing for a flexural transducer element.

In further practical embodiments for example the gap can be oriented parallel to a plane along the Z axis. In this case a Couette flow will establish in the gap and a reaction force is transferred in parallel to the gap.

Figure 3:
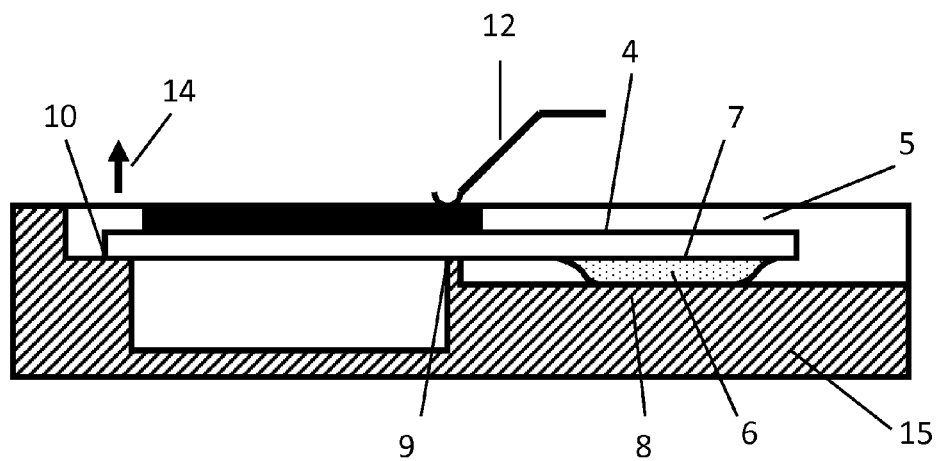
FIG. 3 shows a further practical configuration of the power transfer material in the gap of a fluid bearing.
Figure 4:
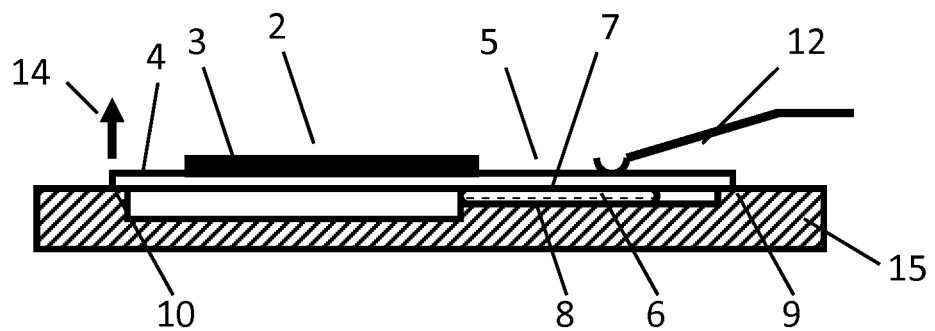
FIG. 4 shows an alternative configuration of a bearing of an actuation device according to the invention with regard to FIG. 1.

In further practical embodiments instead of a gap an open or closed cavity may be contained in the housing, which at least surrounds a section of the flexural transducer element and which is at least partially filled with viscous power transmitting fluid 6, see also FIG. 3 or FIG. 4.

Preferably suitable as a power transmission fluid are fluids with a medium and high viscosity, such as certain resins and oils, particularly silicone oils, but also solid materials that comprise a high ability to relaxate or creep.

With view to an easy fabrication it is advantageous to configure the fluid bearing as an open gap between a surface of the flexural transducer element and a surface of the housing. According to the invention the viscous power transmitting fluid is contained at least in sections of the gap. The interactions between the power transmission fluid and the wetted surface determine the location and behavior of the fluid bearing in the gap.

In the configuration of FIG. 2A the power transmission fluid and the two adjacent surfaces both exhibit a contact angle of >90°, i.e. the power transmission fluid will contract. By this the internal fluid pressure exceeds the external pressure and as a result the fluid pressure exerts a resultant force upward onto the flexural transducer element. Provided the flexural transducer element is pressed by a sufficiently stiff spring element 12 onto the pivot bearing 9, the surface tension forces of the power transfer fluid will result in a pressure force onto the stop 10. A contact angle of >90° for example can be achieved by a hydrophobing step, e.q., by a Teflon coating or by applying nano-layers. A hydrophobic conditioning of the housing in particular in the region of the viscous power transmitting fluid can further prevent the fluid to creep out of the gap or to flow together with the viscous power transmitting fluid of an adjacent channel in the case of an array arrangement of actuation devices according to the invention.

An advantageous variant of the actuation device according to the invention thus contains a fluid bearing which transfers reaction forces or moments from one surface of the flexural transducer element via the viscous power transmitting fluid onto a surface of the housing, whereby at least in sections the wetting angle between the housing and the power transmission fluid exceeds 90°.

A further advantageous variant of the actuation device according to the invention includes structured sections within the housing, in which the wetting angle between the housing and power transmission fluid exceeds 90° and further includes adjacent sections, where the wetting angle between the housing and the power transmission fluid is below 90°.

A third advantageous variant of the actuation device according to the invention includes areas in the region of the fluid bearing, in which the wetting angle between the housing and the power transmission fluid exceeds 90° and in which the wetting angle between a surface of the flexural transducer element, which is in contact with the power transmission fluid and the power transmission fluid is below 90°.

A fourth advantageous variant of the actuation device according to the invention includes areas of the flexural transducer element in the region of the fluid bearing, in which the wetting angle between the housing and the power transmission fluid is below 90° and areas of the flexural transducer element in a region towards the movable part of the flexural transducer element, in which the wetting angle of the viscous power transmitting fluid and the flexural transducer element exceeds 90°, such, that the power transmitting material is inhibited at the boundary between the regions of different wetting angle to pass from the region of the fluid bearing to the movable region of the flexural transducer element.

A fifth advantageous variant of the actuation device according to the invention includes areas of the housing in the region of the fluid bearing, in which the wetting angle between the housing and the power transmission fluid is below 90° and areas of the housing in a region towards the movable part of the flexural transducer element, in which the wetting angle between the viscous power transmitting fluid and the housing exceeds 90°, such, that the power transmitting material is inhibited at the boundary between the regions of different wetting angle to pass from the region of the fluid bearing in the housing to the region in the housing being adjacent to the movable region of the flexural transducer element.

In a sixth advantageous variant, the flexural transducer element is designed or treated such, that the wetting angle between power transmission fluid and flexural transducer element basically exceeds 90°.

In a seventh advantageous variant the substrate layer of the flexural transducer element is designed or treated such, that the wetting angle between power transmission fluid and the substrate layer of the flexural transducer element basically exceeds 90°.

Figure 2:
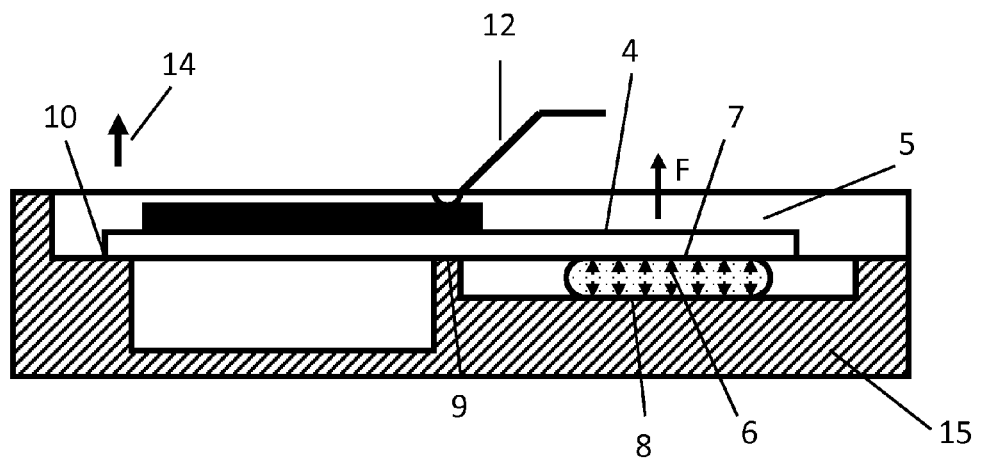
FIG. 2 shows a practical configuration of the viscous power transmitting fluid in the gap of a fluid bearing.

In FIG. 2 variant is shown where the wetting angle between the viscous power transmitting fluid and the substrate layer of the flexural transducer element and between the viscous power transmitting fluid and the housing exceeds 90°. In this configuration the fluid bearing produces an upward force.

In FIG. 3 an advantageous variant is shown where the wetting angle between the viscous power transmitting fluid and the substrate layer of the flexural transducer element is below 90° and between the viscous power transmitting fluid and the housing exceeds 90°. This configuration ensures a defined position and distribution of the viscous power transmitting fluid relative to the flexural transducer element while preventing lateral flow of the fluid in the transmission housing. In a modification of the variant of FIG. 3 in the area of the fluid bearing below the flexural transducer element there is a limited area in the housing, where the wetting angle between viscous power transmitting fluid and the substrate layer of the flexural transducer elements below 90°.

In an further variant the surface that is assigned to the housing, is at least partially modified such that the wetting angle between the surface 8, which is assigned to the housing and the viscous power transmitting fluid exceeds 90°. The modification can be made by diffusing a substance into the material of the housing, by a surface coating or by a specific change of the surface structure with defined roughness profiles. Suitable coatings, for example, are fluor-polymer coatings such as PTFE, PFA, FEP or PVDF layers. When using for example a PTFE coating principally very highly wetting silicone oils can be used as power transmitting material.

In another advantageous variant, the surface 8 of the fluid bearing, which is associated with the housing contains a sharp lateral edge, which prevents the viscous power transmitting fluid from passing. Such an edge may for example be realized by a sufficiently wide rectangular groove in the housing around the area of the fluid bearing 5. Since in this variant the inner edge has an angle of 270°, an overstepping of viscous power transmitting fluid will also be prevented if the wetting angle between the housing and the associated surface 8 is smaller than 90°.

If slow parasitic movements occur, the gap distance changes and the power transmission material is displaced within the gap. In case of a movement that results in a reduction of the gap distance a reservoir must be available to buffer the displaced fluid, i.e. to accumulate and submit fluid again. Conversely, in buffer additional viscous power transmitting fluid has to be made available for the case that the gap increases during a movement. In a first variant in which the viscous power transmitting fluid fills only a portion of the gap, the volume of the remaining gap serves to buffer viscous power transmitting fluid. In another variant, a cavity, that is open at least on one side, can be integrated in the area of the fluid bearing either within the flexural transducer element and/or in the housing, to buffer viscous power transmitting fluid. In a third variant the gap of the fluid bearing contains viscous power transmitting fluid, while the surface of the fluid bearing, which is associated with the housing, extends laterally over the corresponding surface of the viscous power transmitting fluid. In this variant, the excessive viscous power transmitting fluid can accumulate along the side edge of the flexural transducer element and get back into the gap at an inverse motion.

Figure 5:
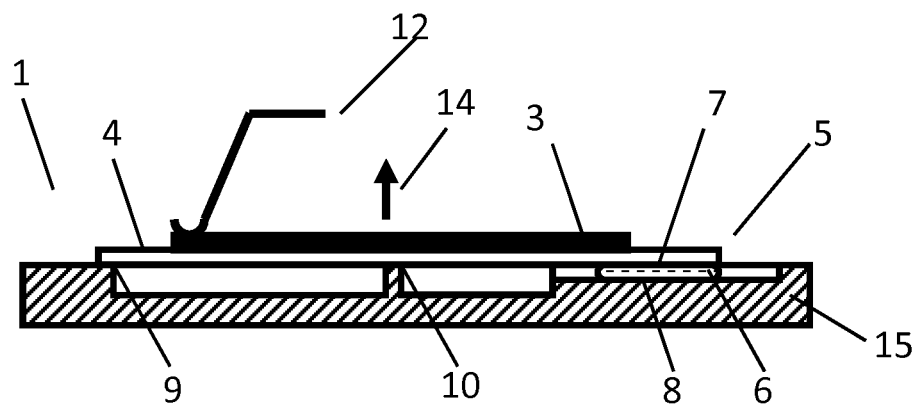
FIG. 5 shows a practical configuration of an actuation device according to the invention with a centrally arranged control area.

In FIG. 1 an embodiment according to the invention is shown, in which the support 9 is located between the reference stop 10, which is in the moving section, and the fluid bearing 5. The latter generates as bearing reaction the counter-torque to the control forces in the case of fast actuator deflections 14. Another variation is shown in FIG. 4. In this variant, the fluid bearing 5 is located between a reference stop 10 in the left, movable section and a support 9 on the right. The fluid bearing 5 is located on the right section near to the support 9, so the right section of the flexural transducer element behaves like a fix clamping in the case of fast actuator deflections 14. A spring element 12 presses near to the right bearing onto the flexural transducer element, thus securing the contact of the flexural transducer element with the bearing 9 and the stop 10. FIG. 5 shows an embodiment, wherein the flexural transducer element performs its actuator deflection 14 in a central section. In this section there is also a reference stop 10. The pivot bearing and the support respectively are located at the left end of the flexural transducer element. The contact force to maintain a reference position is again supplied by a spring element 12 being located near to the support 9. The fluid bearing is located near to the right end of the flexural transducer element and behaves like a fix clamping in the case of fast actuator deflections 14.

Due to the ability of the actuation device according to the invention to compensate for external disturbances on the one hand and to secure an exactly defined reference position without a need for a fine-tuning on the other hand, the actuation device according to the invention is preferable suited for the realization of a micro-valve or a micro-valve array, more preferable suited for the realization of a micro pneumatic valve or micro pneumatic valve-array. These are, for example, applicable as a pilot or control valve for pneumatically driven applications such as pneumatic actuators or actuator arrays, pneumatically driven hydraulic applications, air control arrays, industrial sorting machines and much more. A micro-valve is realized by associating a sealing portion 21 of a valve 20 with the flexural transducer element 2, which is functionally arranged with a valve seat 22 such, that when electrically actuating the flexural transducer element 2 a fluid passage 23 is being opened or closed. The sealing portion 21 can be a separately manufactured as an add-on component, such as a seal, which is connected with the flexural transducer element connected with this or it can be a part of a layer of the flexural transducer element itself, be the preferred carrier layer. Pneumatic valves according to the invention are preferable applicable as control valves or pilot valves, as switching valve arrays or pilot valve arrays with very short switching times and high switching frequencies.

Figure 6:
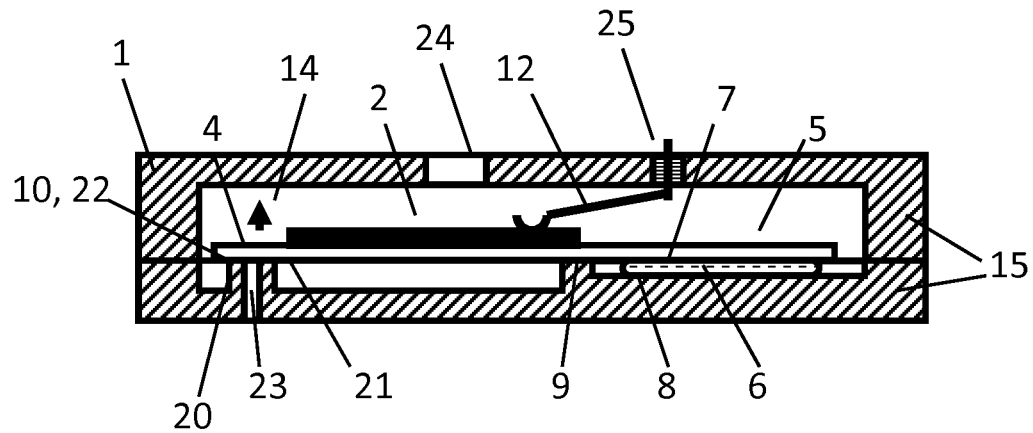
FIG. 6 shows a practical embodiment of a normally closed fluid valve, particularly suitable as a pneumatic pulse valve, based on an actuation device according to the invention.

FIG. 6 shows an embodiment of a micro pneumatic valve according to the invention in a normally-closed configuration, suitable as a pulse valve. The flexural transducer element 2 is contained in a cavity, which via a fluid inlet 24 is connected with a pressure source. In the area where the actuator deflection 14 takes place, there is a valve 20 with a fluid passage 23, which in the non actuated state is closed by a region of the substrate layer 4, that forms the sealing member 21. The valve seat 22 additionally serves as a stop 10 and thus provides an accurate reference position Zref for the flexural transducer element. The closing force is supplied by the spring element 12 and by the pressure difference across the valve. The spring element, which is also used for electrical contacting of the piezoelectric layer 3, is fixed by using an isolated through-connection through the housing 25. When actuating the micro-pneumatic valve of FIG. 6 stationary, the flexural transducer element quickly deflects from the valve seat, because the fluid bearing 5 behaves hard under dynamic loading. In the stationary state the spring force of the spring element 12 and the differential pressure through the valve contribute, that the deflected flexural transducer element as a whole tilts around the support and finally closes the valve passage. For this reason, the valve of FIG. 1 can only be used for a short opening times, i.e. as a pulse valve.

Figure 7:
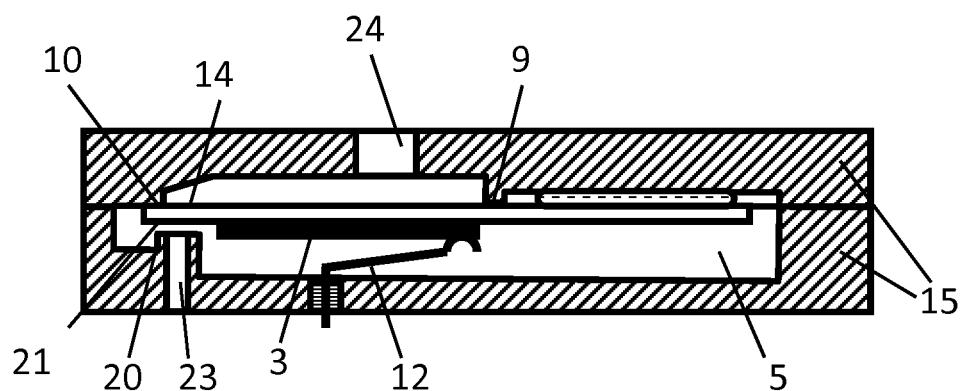
FIG. 7 shows a practical embodiment of a normally open pneumatic valve, based on an actuation device according to the invention.

FIG. 7 shows an embodiment of a normally-open micro pneumatic valve according to the invention. In the region of the actuator deflection 14 of the flexural transducer element 2 the latter is in contact with stop 10 in the upper housing in its reference state, effected by spring element 12. In the facing region of the lower housing part 6, the components of a valve 20 are arranged as in the embodiment of FIG. 6. The stop 10 is arranged in the housing thus, that in the non-deflected reference position Zref there is a defined gap between the valve sealing surface 21 of the flexural transducer element and valve seat 22. When actuating the valve the fluid passage 23 of the valve is closed by the substrate layer of the flexural transducer element. For this the sealing part of the support layer is with view to the valve seat 22 designed thus, that the valve closes. In the dynamic case the valve closing force of the valve of FIG. 3 is supplied by the flexural transducer element in the displaced state, supported by the fluid bearing. A stationary closed state is only possible if the closing force resulting from the differential pressure over the closed valve is larger than the force in opposite direction generated by the spring element. In a preferred embodiment the height of valve gap equals the stationary deflection of the flexural transducer element. This ensures, that both in pulse operation as well as in steady-state operation no compensatory movement of the flexural transducer element around the pivot bearing 9 needs to take place between the open and the closed state of the valve.

Figure 8:
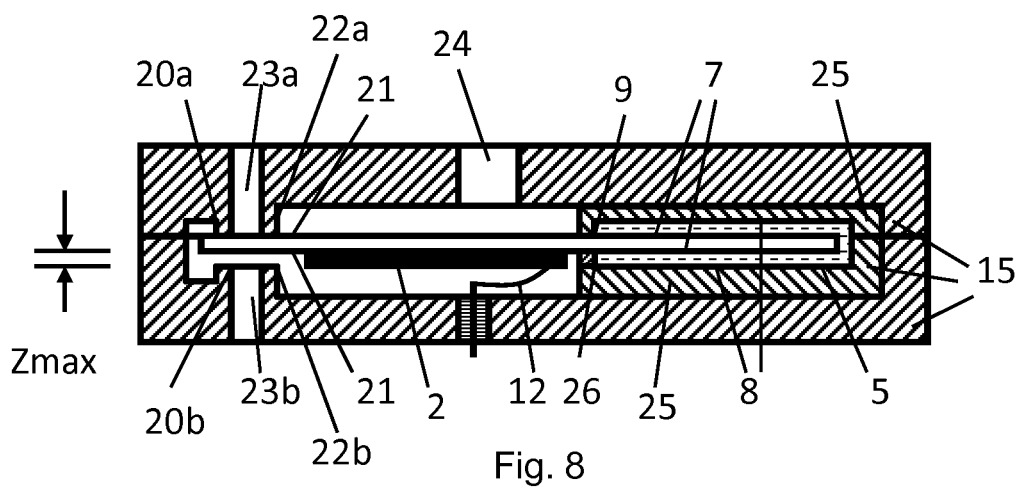
FIG. 8 shows a practical embodiment of a bistable fluid valve, particularly suitable as a pneumatic valve, based on an actuation device according to the invention.

The embodiment shown in FIG. 8 relates to a pneumatic valve, that has a fluid input 24, which can be alternatively connected to two fluid outputs 23a and 23b. The pneumatic valve includes a valve 20a and 20b with a fluid port each, the valves being actuated by the flexural transducer element. It comprises sealing members 21 on both sides, each facing a valve seat, the sealing members being only represented by the upper and lower surfaces of the substrate layer located in a protruding section. With reference to FIG. 8 it shall be shown, that the fluid bearing 5 can also be configured as a fully encapsulated fluid bearing: A housing out of two housing parts 25 surrounds in the region of the fluid bearing the flexural transducer element, which is assigned to the fluid bearing. At the pivot bearing 9 a resilient sealing gasket 26 seals the viscous power transmitting fluid hermetically, that is contained in the fluid bearing. The valve seats 22a and 22b define the two reference positions for the deflection of the flexural transducer element. In these positions the flexural transducer element mainly is pressed on a respective valve seat by the effect of the pressure forces of the pressure medium. A spring element 12, which simultaneously serves for contacting the piezoelectric layer, is dimensioned such, that it applies a force just large enough to keep the flexural transducer element at a predefined initial position: In a non-actuated initial state the flexural transducer element 2 shall be in contact with valve seat 22a. It is mainly the fluid pressure, which closes the valve 20a. When actuating the piezo element the left, movable part of the flexural transducer element deflects in the direction of the valve seat 22b thereby closing the fluid passage 23b of the valve 20b with the assistance of the fluid pressure. In order that the flexural transducer element can switch between the two valve states, the deflection force supplied by the flexural transducer element must excess the fluid pressure forces acting at the valve openings. If the flexural transducer element is further dimensioned in the way, that its full deflection Zmax approximates the gap distance of an open valve, then also in the actuated state the location of the part of the flexural transducer element, which is located in the fluid bearing, will not change over time in a way, that arbitrary actuation sequences could result in temporal changes of the valve behavior. The same is also valid for the embodiment of FIG. 7.

The invention claimed is:

1. Actuation device with a piezoelectric flexural transducer element (2) being pivotally mounted in a housing (15) for carrying out an actuation deflection (14), comprising
   a fluid bearing (5) associated with a portion of the flexural transducer element (2), the fluid bearing including a first surface (7), which is associated with the flexural transducer element (2), a second surface (8), which is associated with the housing (15), and an amount of viscous power transmitting fluid (6) trapped in a gap between the two surfaces,
   a first reference stop (10) in housing 15 to define a reference position (Zref) for the actuator deflection (14),
   a force applying means pressing on the flexural transducer element (2) to maintain flexural transducer element (2) and first reference stop (10) in contact in a reference state.

2. Actuation device according to claim 1, wherein the first surface (7) is associated with a surface of a non-piezoelectric substrate layer (4) of a monomorphic flexural transducer element (2).

3. Actuation device according to claim 1, wherein the amount of viscous power transmitting fluid (6) is trapped in an open or closed cavity in the housing (15), with the section of the flexural transducer element (2) being associated with the fluid is contained in the cavity.

4. Actuation device according to claim 1, characterized in that surface (8), which is assigned to the housing, is an inner surface of an open or closed cavity.

5. Actuation device according to claim 1, wherein silicone oil is used as the viscous power transmitting fluid (6) and to prevent spreading of the oil at least portions of the surfaces of housing and flexural transducer element (2) are made hydrophobic or contain flourine.

6. Actuation device according to claim 1, characterized by a first reference stop (10) in the housing, which acts in the positive Z-direction and a second reference stop (10) in the housing, which acts in the negative Z-direction, to define two reference positions of the actuator deflection (14).

7. Actuation device according to claim 1, wherein the force applying means includes a resilient element (12).

8. Actuation device according to claim 1, wherein the force applying means further serves for establishing an electrical contact.

9. Actuation device of claim 1, wherein the force applying means includes a pneumatic pressure force.

10. Actuation device according to claim 1, wherein the force applying means includes a surface tension force, which is associated with the viscous power transmitting fluid (6).

11. Actuation device according to claim 1, wherein the flexural transducer element (2) is associated with the sealing member (21) of a pneumatic valve (20), the sealing member (21) being with respect to a valve seat (22) functionally arranged such, that, when electrically actuated, a fluid passage (23) is closed or released.

12. Actuation device according to claim 1, characterized in that the sealing part (21) is part of the substrate layer (4) of the flexural transducer element (2) itself.

13. Actuation device according to claim 1, wherein the flexural transducer element (2) is associated with a first sealing member (21a) of a first pneumatic valve (20a) being functionally arranged with a first valve seat (22a) closing or releasing a first fluid passage (23a) and is further associated with a second sealing member (21b) of a second pneumatic valve (20b) being functionally arranged with a second valve seat (22b) closing or releasing a second fluid passage (23b), whereby upon electrical actuation of the transducer element (2) the first fluid passage (23a) and the second fluid passage (23b) are closed and opened inversely.

14. A method of generating multiple pneumatic pressures, the method including the use of an array of actuation devices according to claim 1.

* * * * *